(12) United States Patent
Hsu et al.

(10) Patent No.: US 7,508,084 B2
(45) Date of Patent: Mar. 24, 2009

(54) CMOS IMAGE SENSOR

(75) Inventors: Hung-Jen Hsu, Jhonghe (TW); Fu-Tien Wong, Taoyuan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 292 days.

(21) Appl. No.: 11/253,956

(22) Filed: Oct. 19, 2005

(65) Prior Publication Data

US 2007/0087467 A1  Apr. 19, 2007

(51) Int. Cl.
*H01L 23/544* (2006.01)
*H01L 21/76* (2006.01)
*H01L 21/00* (2006.01)

(52) U.S. Cl. .................. 257/797; 438/401; 438/462; 438/975

(58) Field of Classification Search .......... 438/70, 438/458, 975, 462, 401; 427/240; 359/22; 349/106; 257/797
See application file for complete search history.

(56) References Cited

U.S. PATENT DOCUMENTS

| | | | | |
|---|---|---|---|---|
| 5,135,891 A | * | 8/1992 | Ikeno et al. ............ | 438/70 |
| 5,677,000 A | * | 10/1997 | Yoshioka et al. ........ | 427/240 |
| 5,913,979 A | | 6/1999 | Shen et al. ............. | 134/2 |
| 5,956,564 A | | 9/1999 | Newman et al. ......... | 438/9 |
| 5,982,044 A | | 11/1999 | Lin et al. .............. | 257/797 |
| 6,033,589 A | | 3/2000 | Lin ..................... | 216/92 |
| 6,061,109 A | * | 5/2000 | Suginoya et al. ........ | 349/106 |
| 6,379,992 B2 | * | 4/2002 | Jo ...................... | 438/70 |
| 6,426,812 B2 | * | 7/2002 | Ichikawa et al. ........ | 359/22 |
| 6,506,688 B2 | | 1/2003 | Wu ..................... | 438/759 |
| 6,630,722 B1 | | 10/2003 | Aoki ................... | 257/435 |
| 7,157,352 B2 | * | 1/2007 | Yamanaka ............. | 438/458 |

* cited by examiner

*Primary Examiner*—Davienne Monbleau
*Assistant Examiner*—Monica D Harrison
(74) *Attorney, Agent, or Firm*—Thomas, Kayden, Horstemeyer & Risley

(57) ABSTRACT

A method for forming an image sensor device. An alignment mark is formed on or in a substrate with distance from the alignment mark to the substrate edge less than about 3 mm. An array of active photosensing pixels is formed on the substrate. At least one dielectric layer is formed covering the substrate and the array. A color filter photoresist is formed on the least one dielectric layer. Subsequent to removal of the color filter photoresist from the alignment mark, the color filter photoresist is exposed with alignment to the alignment mark.

20 Claims, 9 Drawing Sheets

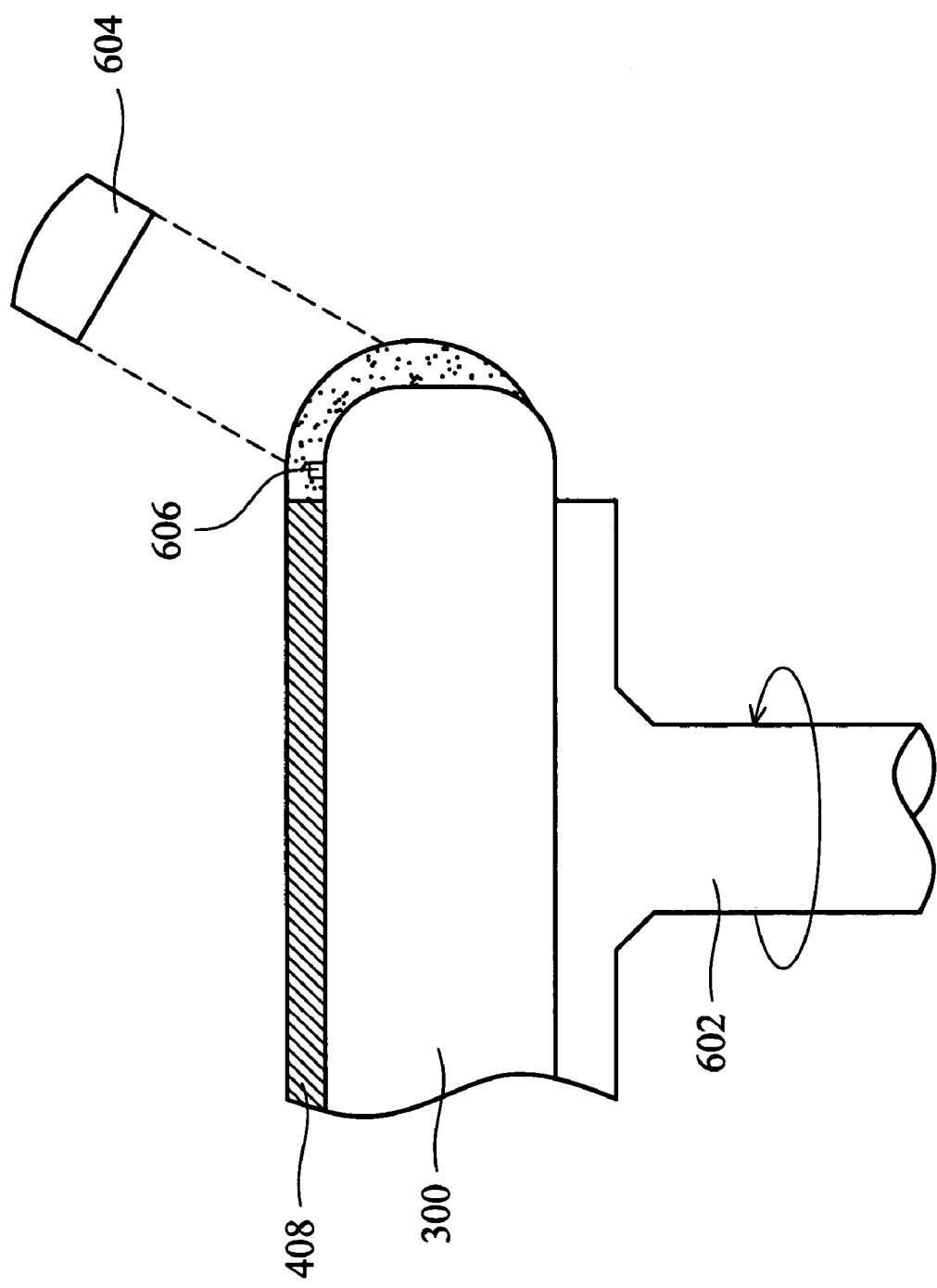

CMOS IMAGE SENSOR

BACKGROUND

The invention relates to an electronic device, and more particularly, to an image sensor device.

CMOS image sensor devices are used in a wide variety of, applications, such as digital still camera (DSC) applications. These devices utilize an array of active pixels or image sensor cells, comprising photodiode elements, to collect photo energy for conversion of images to streams of digital data.

FIG. 1 is a cross section of a typical image sensor device. In FIG. 1, a typical image sensor device 100 is illustrated in cross section, comprising a semiconductor substrate 101 having an array of photodiodes 120 therein. Each photodiode 120 comprises, for example, an n-type region 124 in a p-type region 122. Each photodiode 120 is separated from other photodiodes by an array of isolation structures 110, such as shallow trench isolation (STI). Thus, an array of pixels is obtained. The pixels convert incoming light 160 from a light/image source to electrical signals via the photodiodes 124. The substrate 101 is covered by a series of dielectric layers 130, such as an interlevel dielectric (ILD) layer and intermetal dielectric (IMD) layers. A color filter layer 140 overlying the substrate 101 comprises red regions 140a, green regions 140b and blue regions 140c.

FIG. 2 illustrates curves of wavelength versus transmittance of three major colors. In FIG. 2, the blue curve presents extremely low transmittance at a wavelength of about 580 Å~650 Å. Exposure apparatuses, such as steppers, typically use light with wavelength of 633 Å for alignment. Consequently, extremely low transmittance of the blue photoresist of the color filter is likely to cause alignment failure.

SUMMARY

An embodiment of a method for forming an image sensor device comprises forming an alignment mark overlying or in a substrate with distance from the alignment mark to the substrate edge less than about 3 mm. An array of active photosensing pixels is formed overlying the substrate. At least one dielectric layer is formed covering the substrate and the array. A color filter photoresist is formed overlying the dielectric layer. Subsequent to removal of the color filter photoresist over the alignment mark, the color filter photoresist is exposed with alignment to the alignment mark.

Also provided is a method for forming an image sensor device, comprising forming an alignment mark overlying or in a substrate with a distance from the alignment mark to the substrate edge less than about 3 mm. A photoresist with low transmittance at wavelength of 550~650 nm is coated over the substrate, and photoresist at the substrate edge is removed. An exposure apparatus comprising a beam with wavelength of 550~650 nm aligned through a mask to the alignment mark exposes the photoresist.

Further provided is a wafer with a plurality of image sensing devices and an alignment mark overlying or in the wafer. The distance from the alignment mark to the wafer edge is less than 3 mm. The image sensing devices comprise a color filter photoresist covering the wafer while exposing the alignment mark.

Further scope of applicability of the invention will become apparent from the detailed description given hereinafter. However, it should be understood that the detailed description and specific examples, while indicating embodiments of the invention, are given by way of illustration only, since various changes and modifications within the spirit and scope of the invention will become apparent to those skilled in the art from this detailed description.

DESCRIPTION OF THE DRAWINGS

The invention can be more fully understood by reading the subsequent detailed description in conjunction with the examples and references made to the accompanying drawings, wherein:

FIG. 6A~6B shows a wafer edge exposure method in a embodiment of the invention;

DETAILED DESCRIPTION

Figure 1:
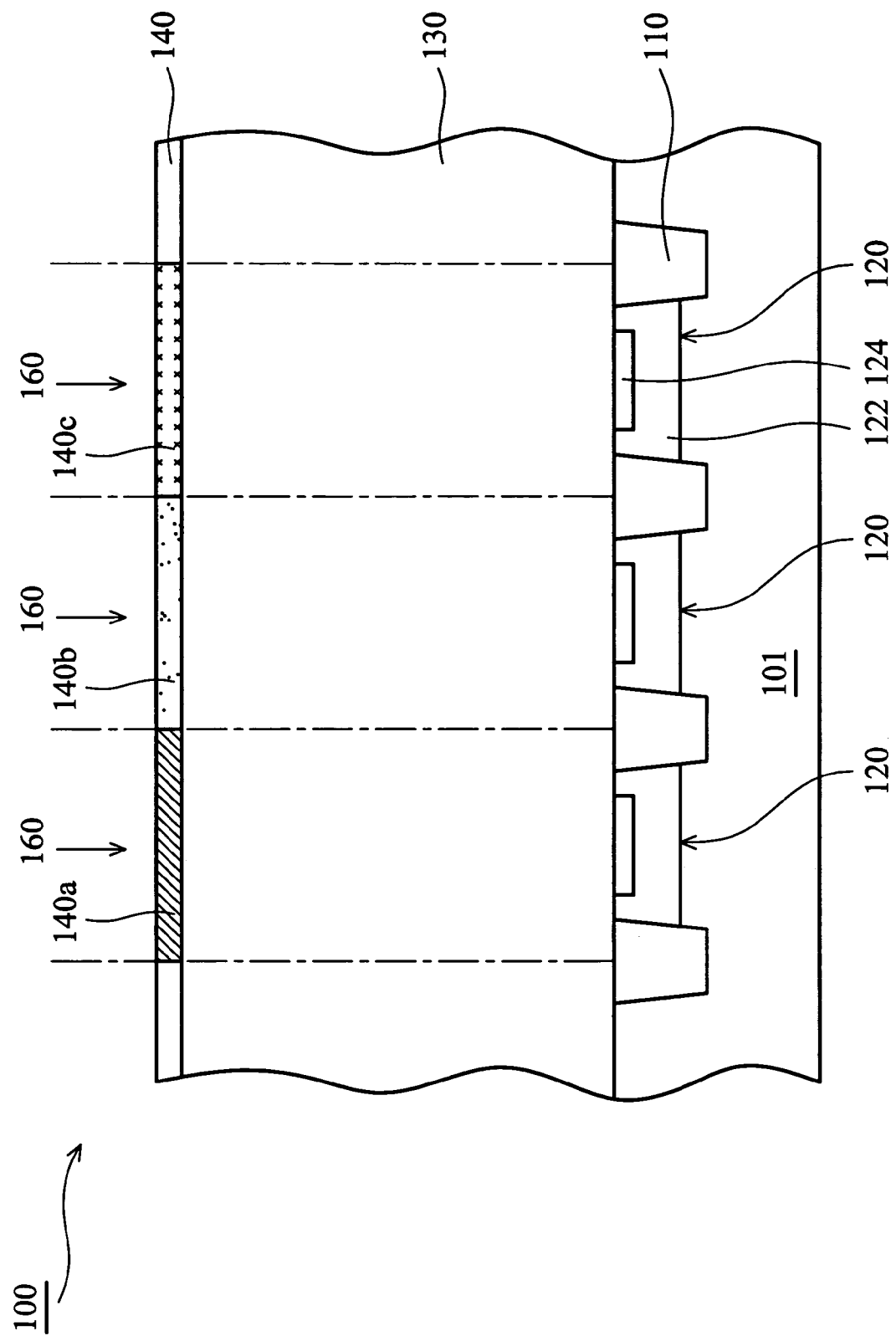
FIG. 1 is a cross section of a typical image sensor device.
Figure 2:
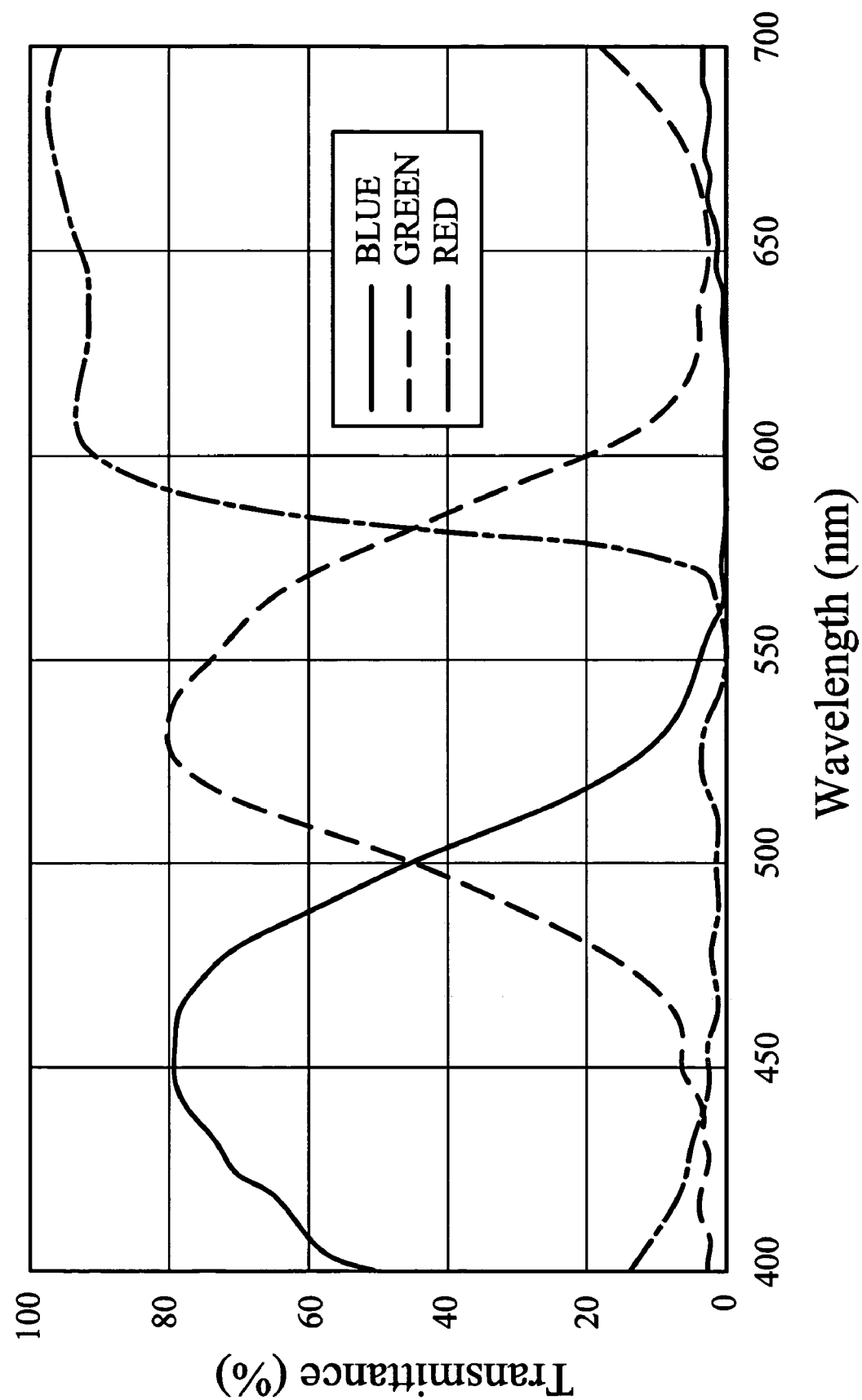
FIG. 2 illustrates curves of wavelength versus transmittance of three major colors.
Figure 3A:
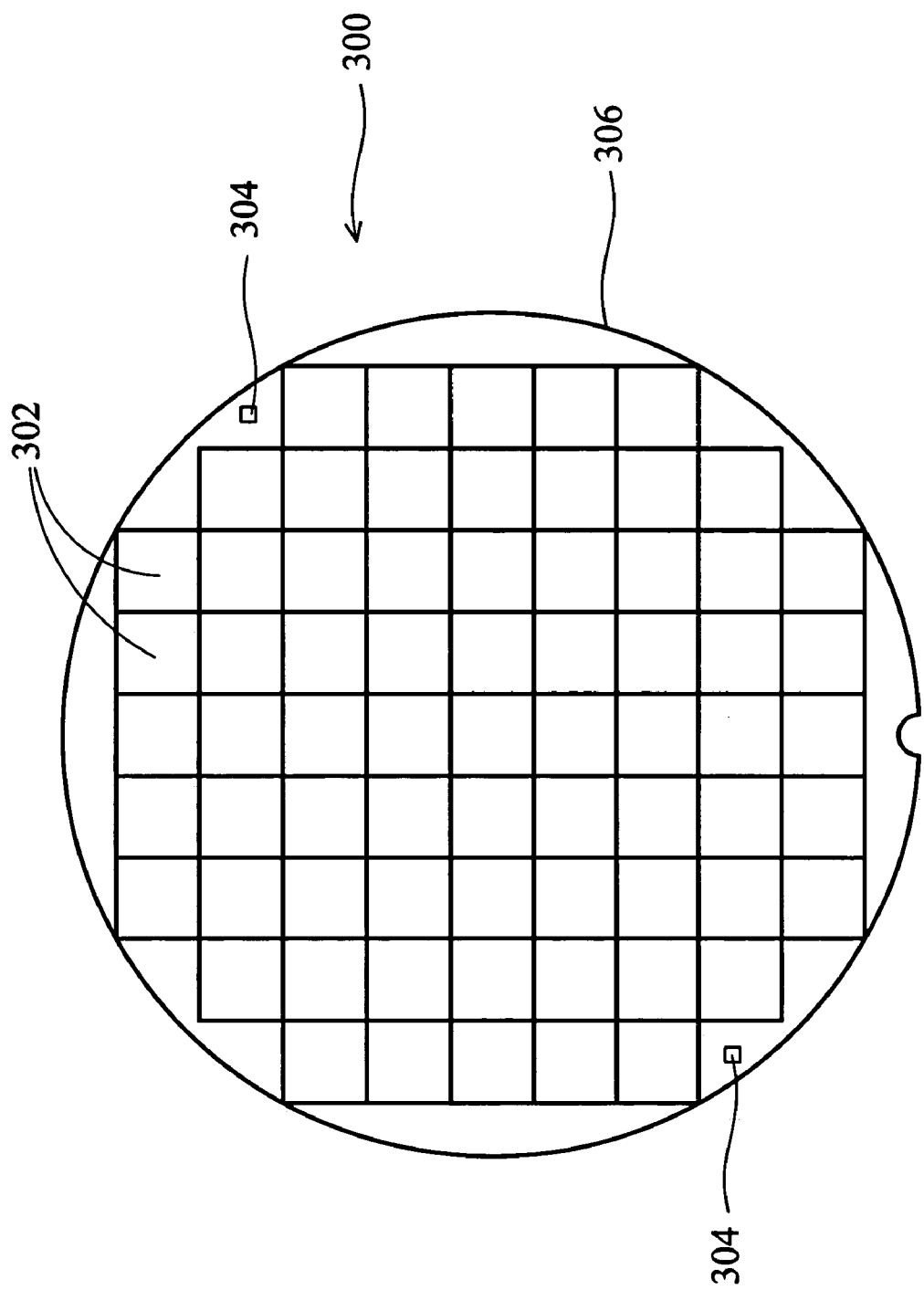
FIG. 3A shows an array of chip areas or die areas in which image sensor devices are fabricated.

FIG. 3A shows an array of chip areas or die areas 302 in which image sensor devices are fabricated, with alignment marks 304 at the periphery of a substrate 300, i.e. a wafer. Preferably, the distance from the alignment marks 304 to the wafer edge 306 is substantially less than 3 mm, more preferably less than 2 mm. The alignment marks are aligned during definition of a color filter layer of the image sensor devices by an exposure apparatus. In an embodiment of the invention, the alignment marks 304 are disposed in the wafer, formed by lithography and etching of silicon wafer. In an alternative embodiment of the invention, the alignment marks 304 are disposed overlying the wafer.

Figure 3B:
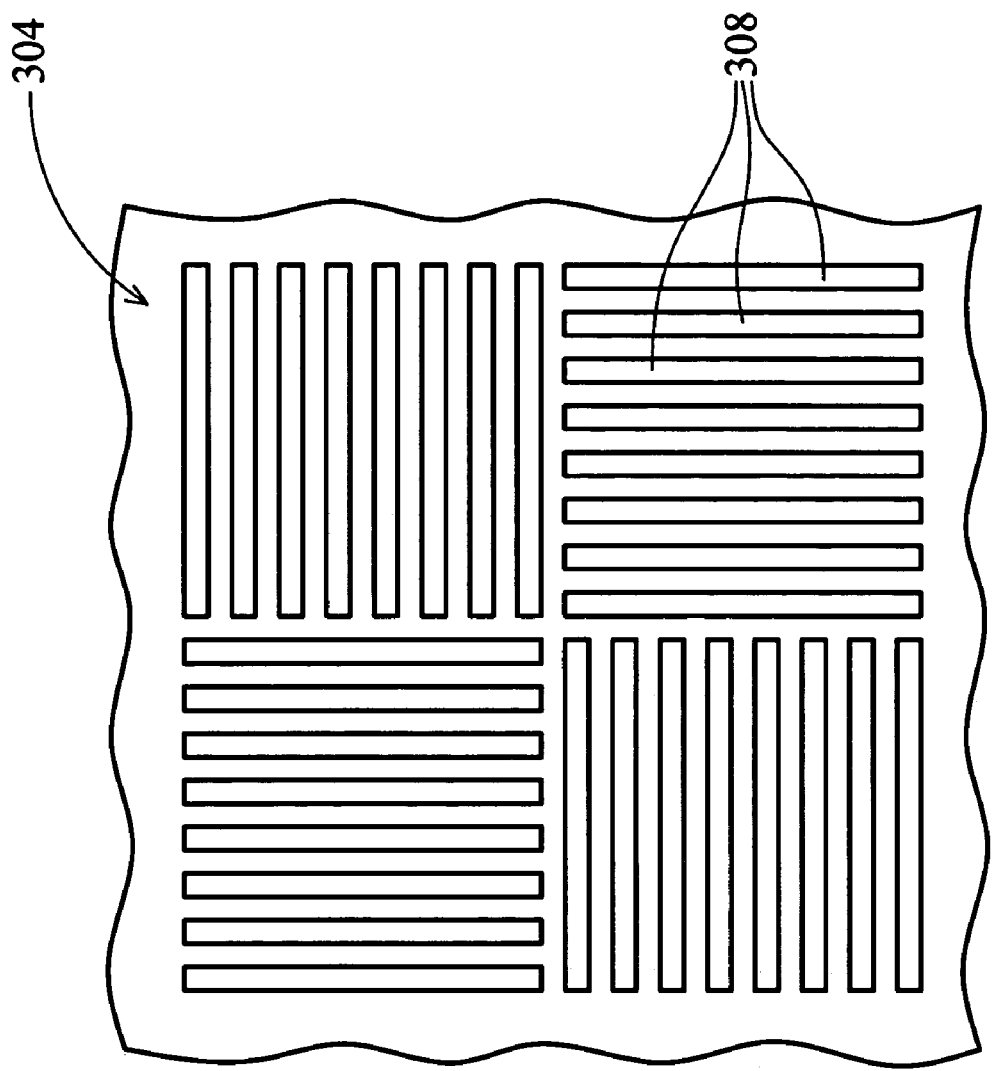
FIG. 3B shows a greatly enlarged top-view of one of the alignment marks.

FIG. 3B shows a greatly enlarged top-view of one of the alignment marks 304. The alignment marks comprise several arrays of grooves 308 aligned along the x- and y-axes of a rectangular coordinate system aligned with reference to the substrate stage. While the alignment mark with arrays of grooves aligned along the x- and y-axes is used in the embodiment, the disclosure is not limited thereto.

Figure 4:
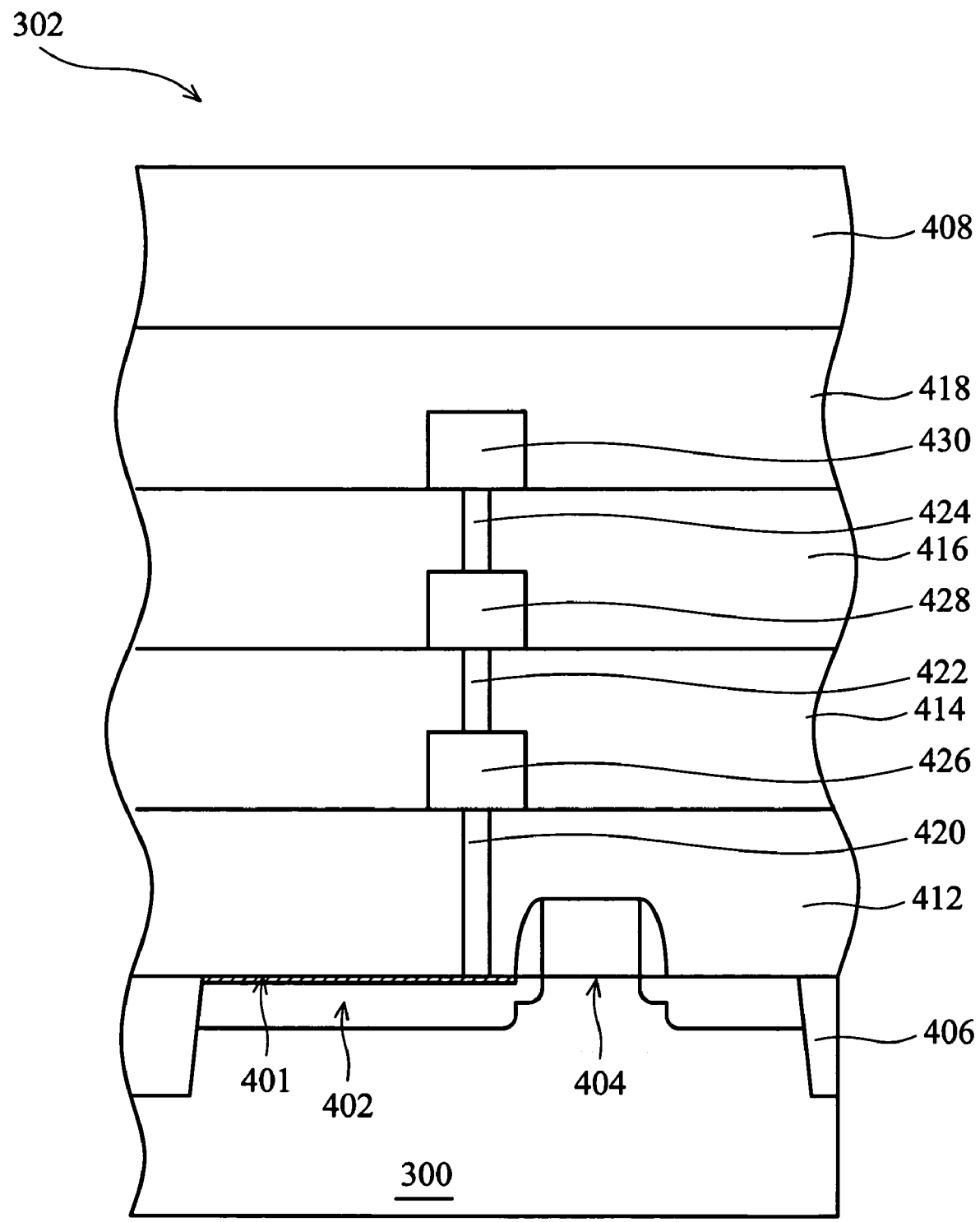
FIG. 4 is a cross section of a pixel of an embodiment of an image sensor device.

FIG. 4 is a cross section of a pixel of the embodiment of an image sensor device. In FIG. 4, an active photosensing pixel of an image sensor device 302 comprises the semiconductor substrate 300 comprising an array of photodiodes 402 and a CMOS logic circuit 404. The active photosensing pixel comprises a photodiode 402 with a pinned layer 401 thereon. Each photodiode 402 is separated from other photodiodes by an array of isolation structures 406, such as shallow trench isolation (STI) structures. At least one dielectric layer is disposed on the substrate covering the active photosensing pixel. A color filter 408 is disposed on the least one dielectric layer.

The substrate 300 can be, for example, covered by a series of dielectric layers, such as an interlevel dielectric (ILD) layer 412, intermetal dielectric (IMD) layers 414 and 416, and a passivation layer 418. Dielectric layers 412, 414, 416, 418 comprise a silicon oxide layer, a silicon nitride layer, a silicon oxynitride layer, or spin-on materials. Each dielectric layer has a thickness of approximately 0.2 to 1.5 μm. The thickness of the silicon oxide layer preferably less than approximately 4.5 μm, and thickness of the silicon nitride layer preferably less than approximately 0.5 μm. Further, a 4-layer interconnect is disposed in the dielectric layer. A wire pattern of interconnects 420, 422, and 424 and metal lines 426, 428 and 430 is formed in the IMD layers 414, 416 and passivation layer 418.

The color filter photoresist 408 is coated on the passivation layer 418 at a thickness of approximately 0.5 to 6.0 μm, preferably less than 1.0 μm. The color filter photoresist comprises red photoresist, green photoresist and blue photoresist. The blue photoresist, however, presents low transmittance at wavelength of about 550~650 nm, thus generating alignment failure.

Figure 5:
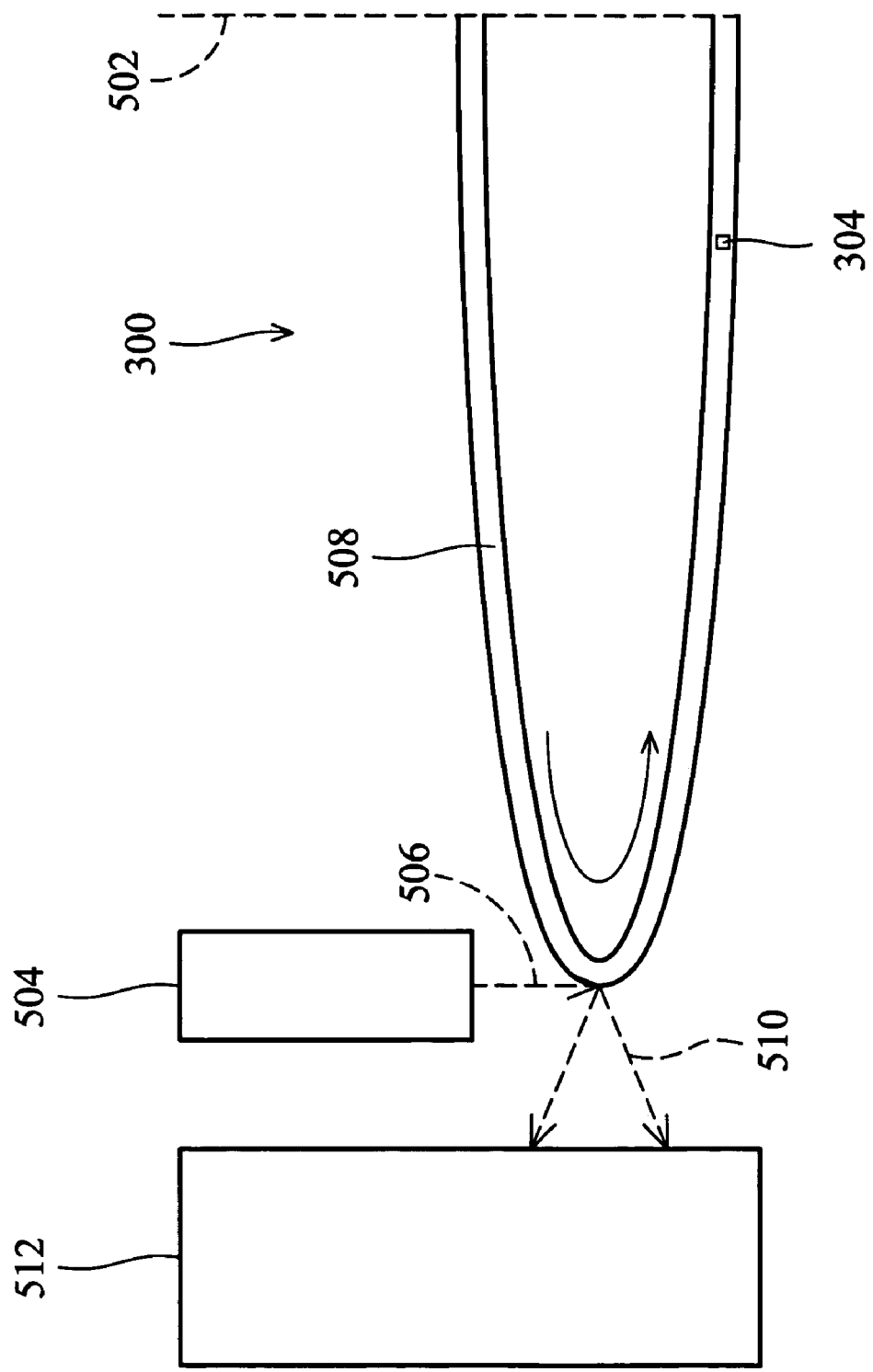
FIG. 5 shows a solvent edge rinse process in an embodiment of the invention.

Subsequent to coating of the color filter photoresist 408, a solvent edge rinse process is utilized to remove the color filter photoresist 408 from the wafer edge. In the embodiment of a method for forming an image sensor, color filter photoresist layer 408 at the edge of the wafer can be removed in two different processes. The first process is the solvent edge rinse shown in FIG. 5. In this process, wafer 300 with a color filter photoresist (not shown) is placed on a platform (not shown) and spun at a predetermined rotational speed, for example about 500 rpm~7000 rpm, along a spin axis 502. The rotational speed of the wafer 300 can be suitably adjusted for each specific application depending on the thickness of the layer to be removed and the type of chemical solution used. For example, when the color filter photoresist is about 2000~7000 nm thick, the rotational speed is preferably about 4000~7000 rpm, and the process time is about 10~100 sec. As shown in FIG. 5, a chemical solution injector 504 injects chemical solution 506, such as isopropyl alcohol, IPA, on to the color filter photo resist at the top edge 508 of the wafer 300. Preferably, the injection angle of the chemical solution 506 is about 50°~90°. The chemical solution 510 deflected from the edge 508 of the wafer hits the chamber wall 512 and drains to the bottom of the process chamber. The solvent edge rinse process is effective in removing a limited area of the color filter photoresist, i.e., to a width of 2~4 mm, on the top edge 508 of the wafer 300 of the color filter photoresist to expose the alignment marks.

The second process is a wafer edge exposure method. As shown in FIG. 6A, the wafer 300 having the color filter photoresist 408 thereon is mounted on a supporting mean of a rotatable chuck 602, and a light source 604 is located at a position over the supporting mean. The dielectric layer between the substrate and the color filter photoresist layer is not shown for simplicity. After the wafer 300 is placed and mounted on the supporting mean of the rotatable chuck 602, it is rotated as the rotatable chuck 602 spins at a predetermined speed, such as about 500 rpm~7000 rpm. The light source 604 is adjusted to a desired angle, and emits light to expose the color filter photoresist 408 on the edge of the wafer 300 exposed. The light source can be, for example, a mercury lamp that emits a spectrum of ultraviolet light with a wavelength from about 350 nm to about 450 nm or a He—Xe lamp. An i-line source with a wavelength of 365 nm, or a g-line source with a wavelength of 436 nm is commonly used. Other light sources, such as deep-ultraviolet with a wavelength of 240 nm, e-beam and X-ray can also be utilized. In a preferred embodiment of the invention, the light source angle is about 70°~90°.

Figure 6B:
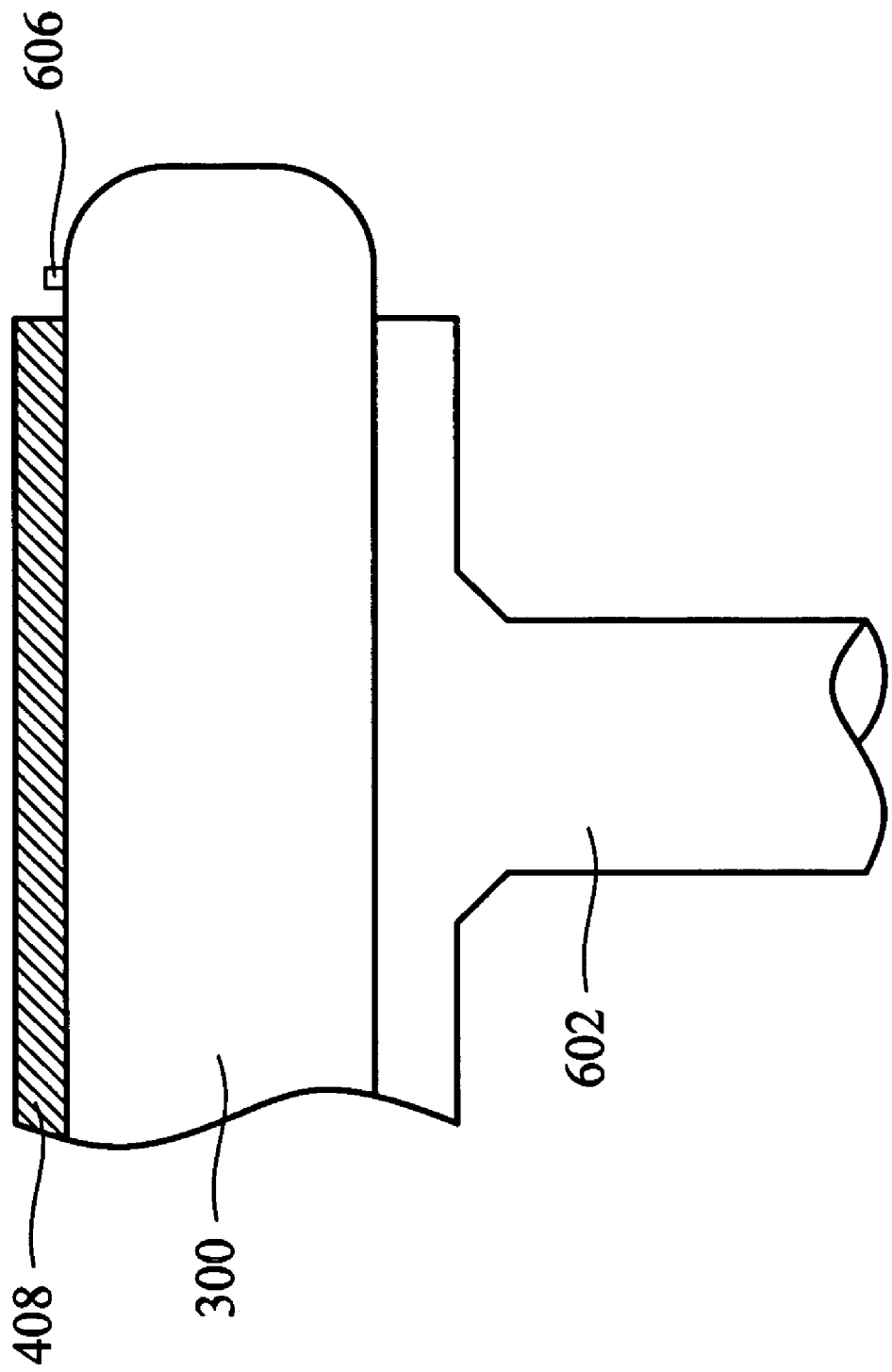

As shown in FIG. 6B, the color filter photoresist layer 408 on the wafer edge is removed during subsequent development process. Due to remove of the color filter photoresist layer 408 at the wafer 300 edge, the alignment marks 606 adjacent to wafer 300 edge are exposed.

Subsequent to removal of the color filter photoresist at wafer edge, the color filter photoresist is exposed by an exposure apparatus, such as a stepper, using an alignment beam with wavelength of 600~650 nm, preferably 633 nm, aligning through a mask (not shown) on to the exposed alignment marks. The color filter photoresist over the alignment marks is removed, and the exposure apparatus can expose the color filter photoresist with beams aligned precisely with the exposed alignment marks. Consequently, alignment failure from the blue photoresist of the color filter photoresist with low transmittance at wavelength of 633 nm is avoided.

Thereafter, conventional development is performed to complete formation of color filter photoresist, and microlenses (not shown) are formed thereon.

Figure 7:
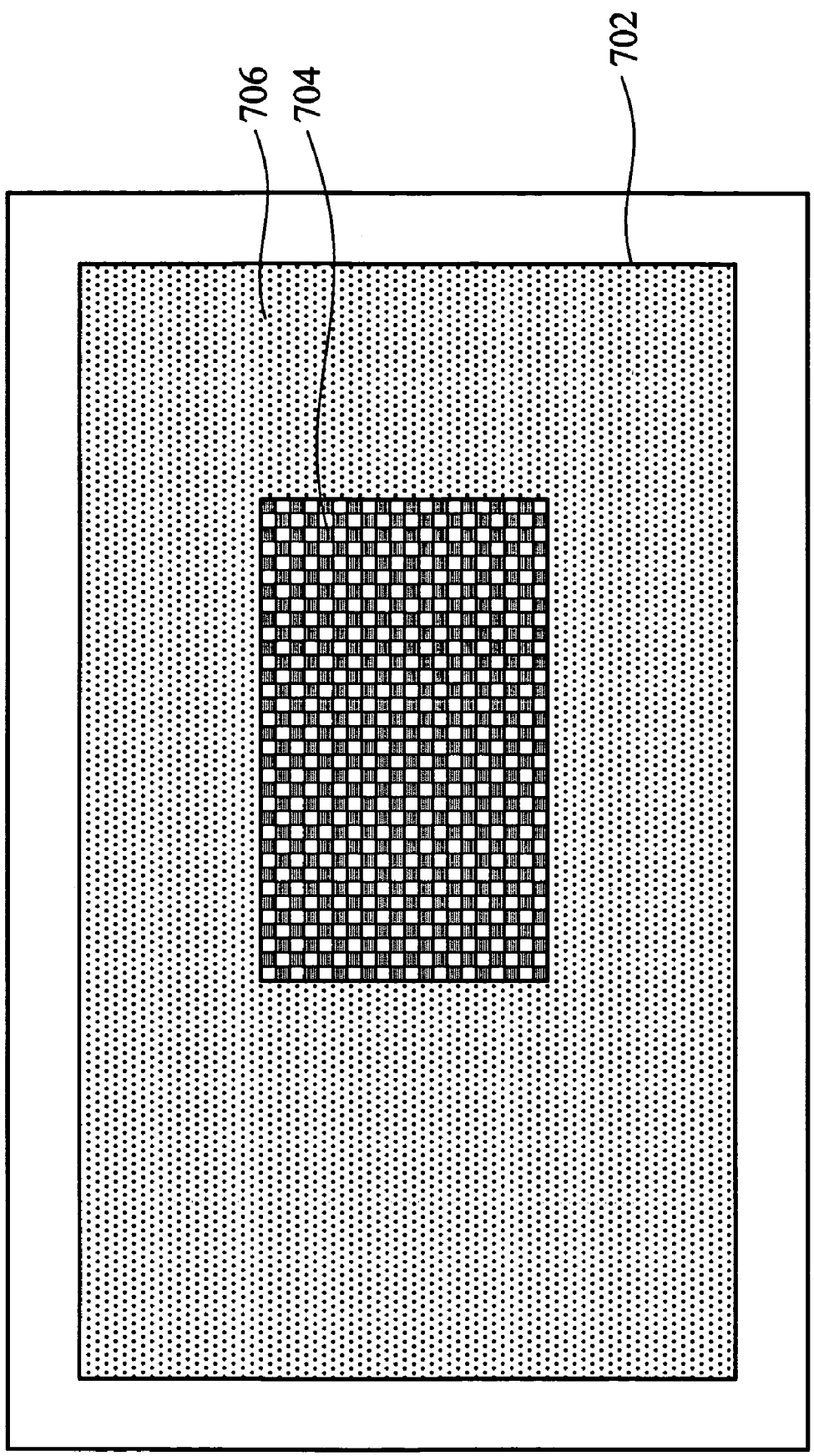
FIG. 7 shows a pixel layout subsequent to formation of a light shielding layer.

FIG. 7 shows a pixel layout subsequent to formation of a light shielding layer. In FIG. 7, the light shielding layer 702 is formed over the color filter photoresist (not shown) to cover peripheral area 706 of the image sensor, in which active pixel arrays are exposed. The light shielding layer typically comprises black photoresist, also presenting low transmittance at wavelength of 633 nm. Exposure apparatus cannot further expose the light shielding layer precisely with beams aligned with the alignment mark, and alignment failure is likely to occur. The light shielding layer 702 can be defined subsequent to removal of the portion from the alignment marks by the described methods to eliminate alignment failure for the low transmittance of black photoresist thereof.

In FIG. 3A, FIG. 4 and FIG. 7, the wafer 300 comprises a plurality of image sensor devices 302. At least one alignment mark 304 is disposed on the wafer 300 at a distance from the wafer edge less than 3 mm. The image sensing devices 302 comprise a color filter photoresist 408 covering the wafer 300 without covering the alignment mark 304. A light shield layer 702 comprising black photoresist is disposed over the color filter photoresist 408 to cover a periphery area 706 of each image sensing device 302 without covering the alignment mark 304.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming an image sensor device, comprising:
    forming an alignment mark overlying or in a semiconductor wafer, wherein distance from the alignment mark to the wafer edge is less than about 3mm;
    forming an array of active photosensing pixels overlying the semiconductor wafer, the array of active photosensing pixels comprising a photodiode and a CMOS logic circuit in the semiconductor wafer;
    forming at least one dielectric layer overlying the semiconductor wafer, covering the array;
    forming a color filter photoresist overlying the at least one dielectric layer;
    removing the color filter photoresist over the alignment mark; and
    exposing the color filter photoresist aligned with the alignment mark.

2. The method according to claim 1, further comprising forming microlenses on the color filter corresponding to the array.

3. The method according to claim 1, further comprising:
    forming a light shield layer over the color filter photoresist;

removing the light shield layer over the alignment mark; and patterning the light shield layer to cover a periphery area of the image sensor device.

4. The method according to claim 3, wherein the light shield layer comprises black photoresist.

5. The method according to claim 1, wherein removal of the color filter photoresist from the alignment mark, comprises the steps of:
   placing the semiconductor wafer on a platform and spinning at a predetermined rotational speed; and
   injecting a chemical solution on to the color filter photoresist at an edge of the semiconductor wafer.

6. The method according to claim 1, wherein removing the color filter photoresist over the alignment mark, comprises the steps of:
   placing the semiconductor wafer on a supporting means of a rotating chuck;
   emitting light to expose the color filter photoresist over the edge of the semiconductor wafer; and
   developing the color filter photoresist.

7. The method according to claim 1, further comprising developing the color filter photoresist.

8. The method according to claim 1, further comprising forming at least one metal line and at least one interconnect in the at least one dielectric layer, wherein the at least one metal line contacts the at least one interconnect, and the at least one interconnect contacts the photodiode.

9. A method for forming an image sensor device, comprising:
   forming an alignment mark overlying or in a semiconductor wafer, wherein distance from the alignment mark to the wafer edge is less than about 3mm;
   forming a photodiode and a CMOS logic circuit in the semiconductor wafer;
   coating a photoresist with low transmittance at wavelength of 550~650nm overlying the semiconductor wafer;
   removing the photoresist at the wafer edge; and
   using an exposure apparatus to expose the photoresist with alignment to the alignment mark.

10. The method according to claim 9, further comprising:
   forming a light shield layer over the photoresist;
   removing the light shield layer over the alignment mark; and
   patterning the light shield layer to cover a periphery area of the image sensor device.

11. The method according to claim 9, wherein the light shield layer comprises black photoresist.

12. The method according to claim 9, wherein removing the photoresist at the wafer edge comprises the steps of:
   placing the semiconductor wafer on a platform and spinning at a predetermined rotational speed; and
   injecting a chemical solution on the photoresist at edge of the wafer.

13. The method according to claim 9, wherein removing the photoresist at the wafer edge comprises the steps of:
   placing the semiconductor wafer on a supporting means of a rotating chuck;
   emitting light to expose the photoresist over the edge of the semiconductor wafer; and
   developing the photoresist.

14. The method according to claim 9, wherein the photoresist comprises a color filter photoresist.

15. The method according to claim 14, further comprising, prior to coating the photoresist:
   forming an array of active photosensing pixels on the semiconductor wafer;
   forming at least one dielectric layer on the semiconductor wafer, covering the array; and
   forming at least one metal line and at least one interconnect in the at least one dielectric layer, wherein the at least one metal line contacts the at least one interconnect, and the at least one interconnect contacts the photodiode.

16. An image sensor device, comprising:
   a semiconductor wafer comprising a plurality of image sensing devices;
   a photodiode and a CMOS logic circuit in the semiconductor wafer in the image sensing devices;
   an alignment mark overlying or in the semiconductor wafer, wherein a distance from the alignment mark to the wafer edge is less than about 3 mm;
   wherein the image sensing devices comprise a color filter photoresist covering the semiconductor wafer without covering the alignment mark.

17. The image sensing device according to claim 16, wherein each image sensing device comprises:
   an array of active photosensing pixels disposed on the semiconductor wafer; wherein at least one of the active photosensing pixels comprises:
   the photodiode and the CMOS logic circuit;
   at least one dielectric layer disposed on the semiconductor wafer covering the array;
   the color filter photoresist on the least one dielectric layer; and
   a microlens on the color filter photoresist.

18. The image sensing device according to claim 16, wherein the color filter photoresist exposes the edge of the semiconductor wafer.

19. The image sensing device according to claim 16, further comprising a light shield layer disposed over the color filter photoresist to cover a periphery area of each image sensing device, wherein the light shield layer exposes the alignment mark.

20. The image sensing device according to claim 19, wherein the light shield layer comprises black photoresist.

* * * * *